(12) United States Patent
Kim

(10) Patent No.: US 10,482,825 B2
(45) Date of Patent: Nov. 19, 2019

(54) DISPLAY DEVICE

(71) Applicant: SAMSUNG DISPLAY CO., LTD., Yongin-si, Gyeonggi-do (KR)

(72) Inventor: Dong-Gyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 93 days.

(21) Appl. No.: 15/418,554

(22) Filed: Jan. 27, 2017

(65) Prior Publication Data

US 2017/0294166 A1 Oct. 12, 2017

(30) Foreign Application Priority Data

Apr. 12, 2016 (KR) .................. 10-2016-0045008

(51) Int. Cl.
*G09G 3/3291* (2016.01)
*G09G 3/3266* (2016.01)
*G11C 19/28* (2006.01)

(52) U.S. Cl.
CPC ......... *G09G 3/3291* (2013.01); *G09G 3/3266* (2013.01); *G11C 19/28* (2013.01); *G09G 2310/0286* (2013.01); *G09G 2310/0297* (2013.01); *G09G 2320/0285* (2013.01); *G09G 2320/043* (2013.01); *G09G 2330/12* (2013.01)

(58) Field of Classification Search
CPC .. G09G 3/3258; G09G 3/3266; G09G 3/3291; G09G 2330/08; G09G 2330/10; G09G 2330/12; G11C 19/28
See application file for complete search history.

(56) References Cited

U.S. PATENT DOCUMENTS

| 2014/0176524 | A1* | 6/2014 | Lee ...................... G09G 3/3233 345/212 |
| 2016/0098960 | A1* | 4/2016 | Park ...................... G09G 3/3233 345/205 |
| 2016/0189614 | A1* | 6/2016 | Tani ...................... G09G 3/3258 345/211 |
| 2016/0189615 | A1* | 6/2016 | Kwon .................. G09G 3/3258 345/214 |
| 2016/0351095 | A1* | 12/2016 | Tani ...................... G09G 3/3275 |
| 2017/0004773 | A1* | 1/2017 | Kim ........................ G09G 3/006 |
| 2017/0162119 | A1* | 6/2017 | Kim ...................... G09G 3/3258 |

FOREIGN PATENT DOCUMENTS

KR 10-2011-0029807 3/2011

* cited by examiner

*Primary Examiner* — Sardis F Azongha
(74) *Attorney, Agent, or Firm* — Lewis Roca Rothgerber Christie LLP

(57) ABSTRACT

A display device includes a display panel including a reference voltage providing portion configured to apply a first reference voltage from a first reference voltage line to a plurality of readout lines and a pixel portion having a plurality of pixels connected to the readout lines, a scan driver providing a scan signal to the pixels via a plurality of scan lines, a data driver providing a data signal to the pixels via a plurality of data lines, a readout circuit converting voltages of the readout lines to digital data, and a controller cutting off a power based on the digital data.

17 Claims, 15 Drawing Sheets

DISPLAY DEVICE

CROSS REFERENCE TO RELATED APPLICATION

This application claims priority to and the benefit of Korean patent Application No. 10-2016-0045008, filed on Apr. 12, 2016, the disclosure of which is hereby incorporated by reference herein in its entirety.

BACKGROUND

1. Field

Example embodiments of the inventive concept relate to a display device.

2. Description of the Related Art

Generally, a display panel includes a plurality of pixels arranged at locations corresponding to crossing regions of scan lines and data lines. When a scan signal is progressively provided to the scan lines, a data signal is provided to the pixels via the data lines in response to the scan signal. The pixels display an image corresponding to the provided data signal.

As a resolution of the display device increases, lines in the display panel are arranged more closely. Accordingly, a crack in the display panel can occur by physical impact, and a short circuit between the lines can occur. In this case, overcurrent can flow through the lines by the short circuit. The display panel can be destroyed or a fire may break out in the display device.

To solve this problem, the display device may include a crack sensing line surrounding a pixel portion to detect a crack in the display device. However, in this case, it may be difficult to detect a crack inside of the pixel portion and a size of a non-display region can increase because the additional line (i.e., the crack sensing line) is added.

SUMMARY

Aspects of example embodiments are directed toward a display device capable of detecting a crack in a display panel.

According to some example embodiments, a display device may include a display panel including a reference voltage providing portion configured to apply a first reference voltage from a first reference voltage line to a plurality of readout lines and a pixel portion having a plurality of pixels connected to the readout lines, a scan driver configured to provide a scan signal to the pixels via a plurality of scan lines, a data driver configured to provide a data signal to the pixels via a plurality of data lines, a readout circuit configured to convert voltages of the readout lines to digital data, and a controller configured to cut off a power based on the digital data.

In example embodiments, the reference voltage providing portion may include a plurality of sensing transistors each including a gate electrode coupled to one of the scan lines, a first electrode coupled to the first reference voltage line, and a second electrode connected to one of the readout lines.

In example embodiments, the scan driver may include (0)th through (N)th stages dependently connected to each other and may be configured to progressively output the scan signal, where N is an integer greater than 0. The (0)th stage may be configured to provide the scan signal to the reference voltage providing portion. The (1)st through the (N)th stages may be configured to provide the scan signal to the pixel portion.

In example embodiments, the reference voltage providing portion may be connected to first terminals of the readout lines. The readout circuit may be connected to second terminals of the readout lines.

In example embodiments, the readout circuit may include an analog-digital converter configured to convert a voltage of one of the readout lines into the digital data, a first switch located between the analog-digital converter and the one of the readout lines, and a second switch located between a second reference power source and the one of the readout lines.

In example embodiments, the readout circuit may be configured to turn on the first switch and to turn off the second switch during a crack sensing period in which the first reference voltage is applied to the readout lines.

In example embodiments, the readout circuit may be configured to turn off the first switch and to turn on the second switch during a displaying period in which the pixels display an image.

In example embodiments, the readout circuit may be configured to turn on the first switch and to turn off the second switch during a deterioration sensing period in which deterioration data of the pixels are measured.

In example embodiments, the analog-digital converter may include a sampling-holding circuit configured to sample and hold the voltage of the one of the readout lines so as to output a readout voltage, and an analog-digital converting circuit configured to convert the readout voltage into the digital data.

In example embodiments, the controller may include a deterioration data calculator configured to compare a current deterioration sensing voltage of the pixels derived from the digital data with a previous deterioration sensing voltage to calculate deterioration data of the pixels, a deterioration compensator configured to compensate input image data based on the deterioration data, a crack detector configured to compare a current crack sensing voltage derived from the digital data with a threshold value to generate a power-off signal, and a control signal generator configured to generate a control signal to cut off power based on the power-off signal.

In example embodiments, the crack detector may be configured to generate the power-off signal when a voltage difference between the current crack sensing voltage and a previous crack sensing voltage stored in a memory device is greater than the threshold value.

In example embodiments, the reference voltage providing portion may include a plurality of sensing transistors each including a gate electrode coupled to a control line, a first electrode coupled to the first reference voltage line, and a second electrode connected to one of the readout lines.

In example embodiments, the controller may be configured to provide a sensing control signal to the control line, and the sensing control signal may be substantially the same as a scan start signal for driving the scan driver.

In example embodiments, the controller may be configured to turn on the sensing transistors during a displaying period in which the pixels display an image.

In example embodiments, each of the pixels may include a first transistor including a gate electrode connected to a first node, a first electrode coupled to a first power line, and a second electrode connected to a second node, a second transistor including a gate electrode connected to one of the scan lines, a first electrode connected to one of the data lines, and a second electrode connected to the first node, a third transistor including a gate electrode connected to the one of the scan lines, a first electrode connected to the second node, and a second electrode connected to one of the readout lines, a storage capacitor connected between the first node and the second node, and an organic light emitting diode (OLED) including a first electrode connected to the second node and a second electrode selectively coupled to the first power line or a second power line.

In example embodiments, the second electrode of the OLED may be configured to be coupled to the second power line during a displaying period and may be configured to be coupled to the first power line during a deterioration sensing period.

According to some example embodiments, a display device may include a display panel including a reference voltage providing portion configured to apply a first reference voltage from a first reference voltage line to a readout line and a pixel portion having a plurality of pixels, a scan driver configured to provide a scan signal to the pixels via a plurality of scan lines, a data driver configured to provide a data signal to the pixels via a plurality of data lines, and a readout circuit configured to convert a voltage of the readout line to digital data. At least two of the pixels may be connected to one of the scan lines and connected to the readout line.

In example embodiments, the reference voltage providing portion may include a sensing transistor including a gate electrode coupled to one of the scan lines, a first electrode coupled to the first reference voltage line, and a second electrode connected to the readout line.

In example embodiments, the scan driver may include (0)th through (N)th stages dependently connected to each other and configured to progressively output the scan signal, where N is an integer greater than 0. The (0)th stage may be configured to provide the scan signal to the reference voltage providing portion. The (1)st through the (N)th stages may be configured to provide the scan signal to the pixel portion.

In example embodiments, the reference voltage providing portion may be connected to a first terminal of the readout line. The readout circuit may be connected to a second terminal of the readout line.

Therefore, a display device according to example embodiments includes a reference voltage providing portion applying a reference voltage to a first terminal of a readout line in response to a scan signal received from the (0)th stage and a readout circuit converting a voltage of a second terminal of the readout line into digital data. The display device can detect a crack in the display panel using the readout circuit and the readout line for compensating for a deterioration of a pixel. Accordingly, the display device can be implemented in a simple structure because the reference voltage providing portion is added only in order to detect the crack.

In addition, the display device cuts off the power when a crack in the display panel is detected, thereby preventing or substantially preventing problems (e.g., a heating problem, a fire problem, etc.) caused by an overcurrent.

BRIEF DESCRIPTION OF THE DRAWINGS

Exemplary embodiments will be described more fully hereinafter with reference to the accompanying drawings, in which various embodiments are shown.

DETAILED DESCRIPTION

Figure 1:
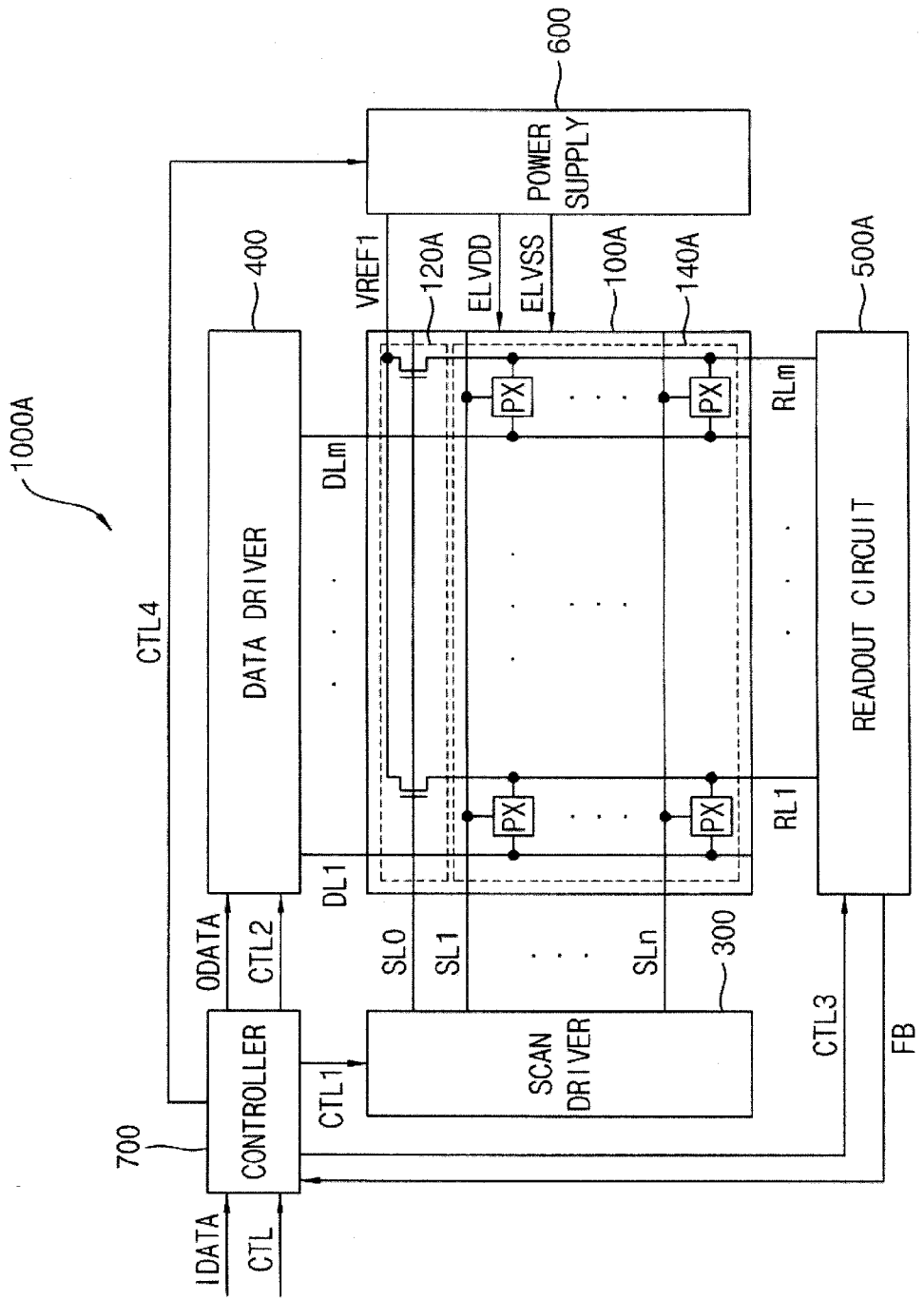
FIG. 1 is a block diagram illustrating a display device according to one example embodiment.

Exemplary embodiments will be described more fully hereinafter with reference to the accompanying drawings, in which various embodiments are shown.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

A relevant device or component (or relevant devices or components) according to embodiments of the present invention described herein may be implemented utilizing any suitable hardware (e.g., an application-specific integrated circuit), firmware (e.g., a DSP or FPGA), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

FIG. 1 is a block diagram illustrating a display device according to one example embodiment.

Referring to FIG. 1, the display device 1000A may include a display panel 100A, a scan driver 300, a data driver 400, a readout circuit 500A, a power supply 600, and a controller 700.

The display panel 100A may include a reference voltage providing portion 120A and a pixel portion 140A.

The reference voltage providing portion 120A may apply a first reference voltage VREF1 to a plurality of readout lines RL1 through RLm. Here, the first reference voltage VREF1 is a voltage for detecting a crack in the display panel 100A. In one example embodiment, the reference voltage providing portion 120A may include a plurality of sensing transistors. Each sensing transistor may include a gate electrode for receiving the scan signal, a first electrode for receiving the first reference voltage VREF1, and a second electrode connected to one of the readout lines RL1 through RLm. For example, each sensing transistor may apply the first reference voltage VREF1 to the readout line in response to the scan signal received from the scan driver 300 via the (0)th scan line SL0.

The reference voltage providing portion 120A may be connected to first terminals of the readout lines RL1 through RLm. The readout circuit 500A may be connected to second terminals of the readout lines RL1 through RLm. Thus, the pixel portion 140A may be located between the reference voltage providing portion 120A and the readout circuit 500A. Therefore, the reference voltage providing portion 120A may apply the first reference voltage VREF1 to the first terminals of the readout lines RL1 through RLm, and the readout circuit 500A may sense voltages of the second terminals of the readout lines RL1 through RLm as crack sensing voltages, thereby detecting a crack in the pixel portion 140A.

The pixel portion 140A may include a plurality of pixels connected to the readout lines RL1 through RLm. For example, the pixel portion 140A may include n*m pixels PX arranged at locations corresponding to crossing regions of a plurality of scan lines SL1 through SLn and a plurality of data lines DL1 through DLm.

The scan driver 300 may provide a scan signal to the pixels PX via the scan lines SL1 through SLn based on a first control signal CTL1. In one example embodiment, the scan driver 300 may include a plurality of stages progressively outputting the scan signal based on a scan start signal and scan clock signals included in the first control signal CTL1. The scan driver 300 may provide the scan signal to the reference voltage providing portion 120A via the (0)th scan line SL0 and may provide the scan signal to the pixel portion 140A via the (1)st through (N)th scan lines SL1 through SLn.

The data driver 400 may provide a data signal DS to the pixels PX via the data lines DL1 through DLm based on a second control signal CTL2.

The readout circuit 500A may be connected to the readout lines RL1 through RLm and may measure a crack sensing voltage or a deterioration sensing voltage based on a third control signal CTL3.

The readout circuit 500A may convert voltages of the readout lines RL1 through RLm to digital data FB and may provide the converted digital data FB as a crack sensing voltage or a deterioration sensing voltage to the controller 700. Here, the crack sensing voltage is a voltage for confirming whether a crack in the display panel 100A occurs or not. Thus, the crack sensing voltage is a voltage of the second terminal of the readout line when the first reference voltage VREF1 is applied to the first terminal of the readout line. Also, a deterioration sensing voltage may correspond to a threshold voltage of the driving transistor included in the pixel.

For example, during the crack sensing period, the readout circuit 500A may convert the voltages of the readout lines RL1 through RLm into the digital data FB and may provide the digital data FB as the crack sensing voltage to the controller 700. Also, during the deterioration sensing period, the readout circuit 500A may convert the voltages of the readout lines RL1 through RLm into the digital data FB and may provide the digital data FB as the deterioration sensing voltage to the controller 700.

The power supply 600 may provide power voltages to the display panel 100A based on the fourth control signal CTL4. The power supply 600 may provide the first power voltage ELVDD, the second power voltage ELVSS, and the first reference voltage VREF1 to the display panel 100A. In one example embodiment, the power supply 600 may provide the first reference voltage VREF1 to the display panel 100A via a first reference voltage line.

In one example embodiment, the power supply 600 may provide the second power voltage ELVSS, via a second power line, to a second electrode of the organic light emitting diode (OLED) during the displaying period and may provide the first power voltage ELVDD, via a first power line, to the second electrode of the OLED during the deterioration sensing period.

The controller 700 may receive an input control signal CTL and may generate the first through fourth control signals CTL1 through CTL4 for controlling the scan driver 300, the data driver 400, the readout circuit 500A, and the power supply 600 based on the input control signal CTL. In addition, the controller 700 may receive the digital data FB from the readout circuit 500A. The controller 700 may convert input image data DATA into output image data ODATA based on the deterioration sensing voltages for pixels derived from the digital data FB. Also, the controller 700 may cut off the power based on the crack sensing voltages derived from the digital data FB in order to prevent or substantially prevent an overcurrent from flowing through the display panel 100A.

Therefore, the reference voltage providing portion 120A applies the reference voltage to the first terminal of the readout line in response to the scan signal, and the readout circuit 500A converts the voltage of the second terminal of the readout line into the digital data. Thus, the display device 1000A may detect a crack in the display panel 100A. The readout circuit 500A and the readout lines RL1 through RLm may be used for detecting a crack in the display panel 100A as well as compensating for the deterioration of the pixels, thereby reducing a size of a non-display region or dead space on which the image is not displayed.

Figure 2:
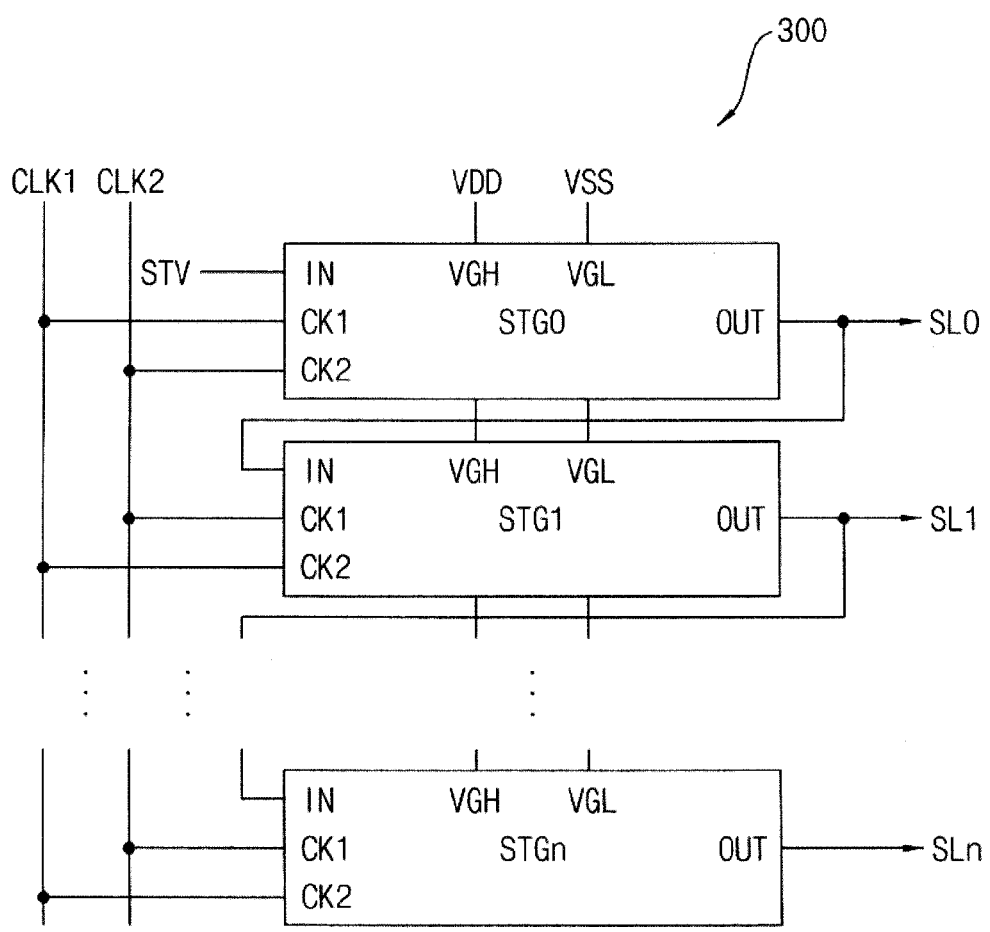
FIG. 2 is a block diagram illustrating an example of a scan driver included in a display device of FIG. 1.

FIG. 2 is a block diagram illustrating an example of a scan driver 300 included in a display device 1000A of FIG. 1.

Figure 3:
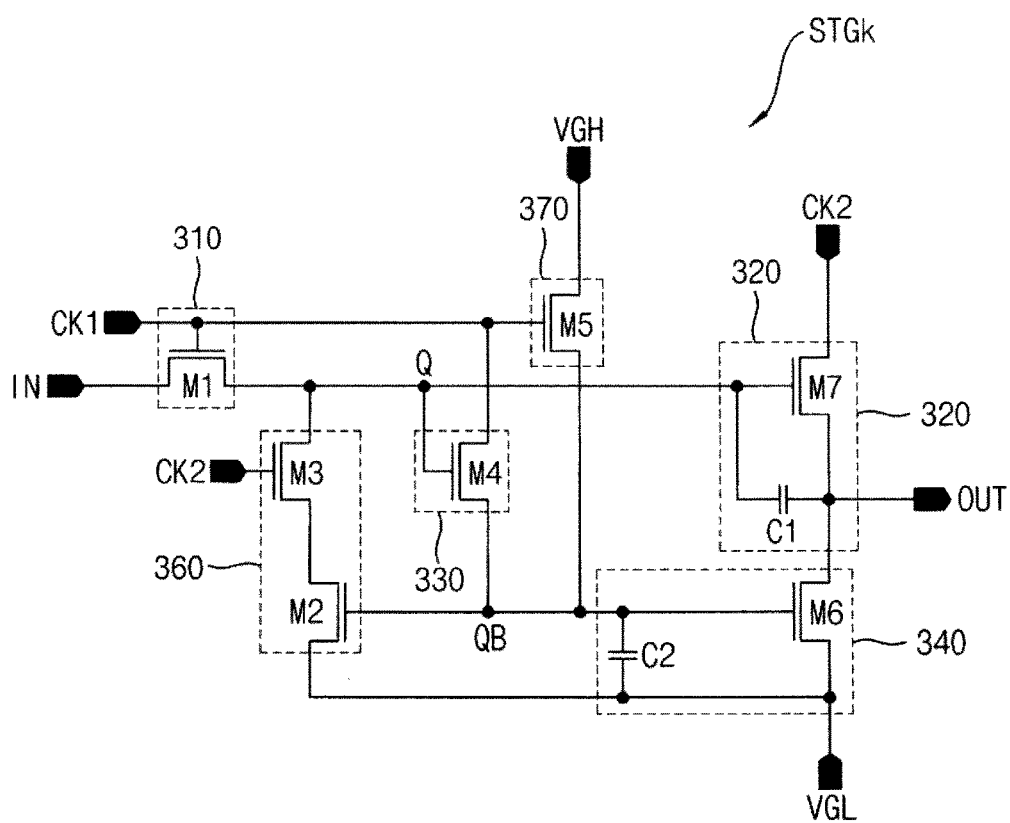
FIG. 3 is a circuit diagram illustrating an example of a stage included in a scan driver of FIG. 2.

FIG. 3 is a circuit diagram illustrating an example of a stage included in the scan driver 300 of FIG. 2.

Referring to FIGS. 2 and 3, the scan driver 300 may include (0)th through (N)th stages STG0 through STGn progressively outputting the scan signal based on a scan start signal STV and scan clock signals CLK1 and CLK2 included in the first control signal CTL1, where N is an integer greater than 0. The (0)th stage STG0 may provide the scan signal to the reference voltage providing portion 120A via the (0)th scan line SL0. The (1)st through (N)th stages STG1 through STGn may provide the scan signal to the pixel portion 140A via the (1)st through (N)th scan lines SL1 through SLn.

As shown in FIG. 2, each stage of the scan driver 300 may include a first clock terminal CK1, a second clock terminal CK2, an input terminal IN, a first voltage terminal VGH, a second voltage terminal VGL, and an output terminal OUT.

A first scan clock signal CLK1 and a second scan clock signal CLK2 having different timings may be applied to the first clock terminal CK1 and the second clock terminal CK2 of each stage. For example, the second scan clock signal CLK2 may be a signal inverted from the first scan clock signal CLK1. In adjacent stages, the first scan clock signal CLK1 and the second scan clock signal CLK2 may be applied in opposite sequences. For example, in the even-numbered stages (e.g., STG0, STG2, etc.), the first scan clock signal CLK1 may be applied to the first clock terminal CK1 as the first clock signal, and the second scan clock signal CLK2 may be applied to the second clock terminal CK2 as the second clock signal. In contrast, in the odd-numbered stages (e.g., STG1, STG3, etc.), the second scan clock signal CLK2 may be applied to the first clock terminal CK1 as the first clock signal, and the first scan clock signal CLK1 may be applied to the second clock terminal CK2 as the second clock signal.

A first voltage VDD may be provided to the first voltage terminal VGH. For example, the first voltage VDD may correspond to a high level voltage.

A second voltage VSS may be provided to the second voltage terminal VGL. For example, the second voltage VSS may correspond to a low level voltage.

A scan start signal SW or a previous scan signal received from one of the previous stages may be applied to the input terminal IN as an input signal. For example, the scan start signal SW may be applied to the input terminal IN of the (0)th stage STG0. The previous scan signals may be respectively applied to input terminals IN of the (1)st through (N)th stages STG1 through STGn. The (0)th through (N)th stages STG0 through STGn may be said to be dependently connected because each of the (1)st through (N)th stages STG1 through STGn may depend on the previous scan signal of the previous stage.

The scan signal may be outputted to the scan line via the output terminal OUT. For example, the scan signals from the output terminals OUT of the even-numbered stages (e.g., STG0, STG2, etc.) may be outputted in sync with a high signal of the second clock signal CLK2. Also, the scan signals from the output terminals OUT of the odd-numbered stages (e.g., STG1, STG3, etc.) may be outputted in sync with a high signal of the first clock signal CLK1.

As shown in FIG. 3, each stage STGk may include a first input circuit 310, a first output circuit 320, a second input circuit 330, a second output circuit 340, a stabilizing circuit 360, and a holding circuit 370. An input signal may be provided to the input terminal IN. A first clock signal may be provided to the first clock terminal CK1. A second clock signal may be provided to the second clock terminal CK2.

A first voltage may be provided to the first voltage terminal VGH. A second voltage may be provided to the second voltage terminal VGL.

In one example embodiment (e.g., FIG. 2), when the stage STGk corresponds to an even-numbered stage, the first clock signal corresponds to the first scan clock signal and the second clock signal corresponds to the second scan clock signal. When the stage STGk corresponds to an odd-numbered stage, the first clock signal corresponds to the second scan clock signal and the second clock signal corresponds to the first scan clock signal. Each stage STGk outputs the scan signal via the output terminal OUT.

The first input circuit 310 may include a first transistor M1. The first transistor M1 may include a gate electrode for receiving the first clock signal, a first electrode for receiving the input signal, and a second electrode connected to a first node Q.

The first output circuit 320 may include a seventh transistor M7 and a first capacitor C1. The seventh transistor M7 may include a gate electrode connected to the first node Q, a first electrode for receiving the second clock signal, and a second electrode connected to the output terminal OUT to which the scan signal is outputted. The first capacitor C1 may include a first electrode connected to the first node Q and a second electrode connected to the output terminal OUT.

The second input circuit 330 may include a fourth transistor M4. The fourth transistor M4 may include a gate electrode connected to the first node Q, a first electrode for receiving the first clock signal, and a second electrode connected to the second node QB.

The second output circuit 340 may include a sixth transistor M6 and a second capacitor C2. The sixth transistor M6 may include a gate electrode connected to the second node QB, a first electrode for receiving the second voltage, and a second electrode connected to the output terminal OUT. The second capacitor C2 may include a first electrode connected to the second node QB and a second electrode connected to the second voltage terminal VGL.

The stabilizing circuit 360 may include second and third transistors M2 and M3 that are connected to each other in series. The second transistor M2 may include a gate electrode connected to the second node QB, a first electrode for receiving a second voltage, and a second electrode connected to a first electrode of the third transistor M3. The third transistor M3 may include a gate electrode for receiving the second clock signal, a first electrode connected to the second electrode of the second transistor M2, and a second electrode connected to a first node Q.

The holding circuit 370 may include a fifth transistor M5. The fifth transistor M5 may include a gate electrode for receiving the first clock signal, a first electrode for receiving the first voltage, and a second electrode connected to the second node QB.

Although the example embodiment of FIGS. 2 and 3 describes that the stages of the scan driver receive two scan clock signals and progressively output the scan signal, the scan driver may be implemented in a variety of other suitable structures progressively outputting the scan signal to the scan lines.

Although the example embodiment of FIGS. 2 and 3 describes that the scan driver progressively outputs the scan signal from the (0)th stage STG0 to the (N)th stage STGn, it is not limited thereto. For example, the scan driver may progressively output the scan signal from the (N)th stage STGn to the (0)th stage STG0.

Figure 4:
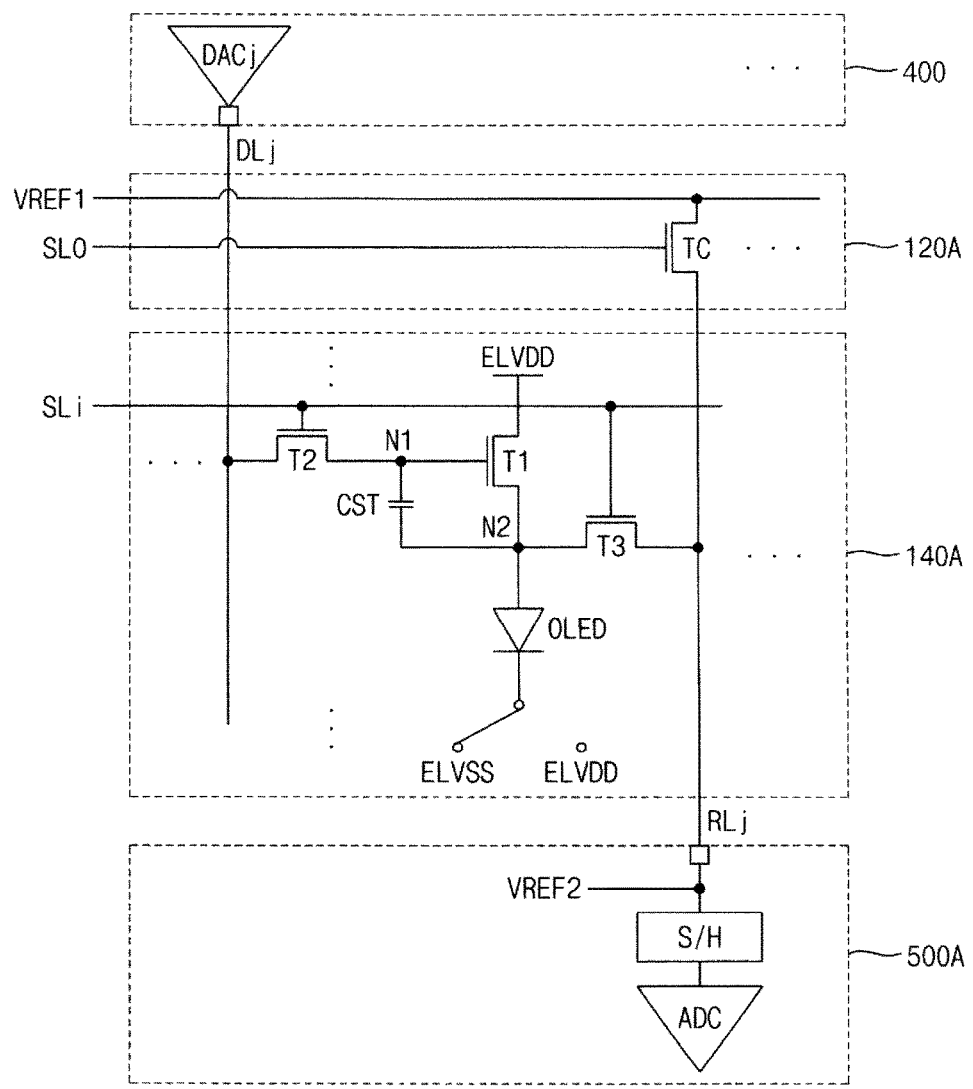
FIG. 4 is a circuit diagram illustrating an example of a reference voltage providing portion and a pixel portion included in a display device of FIG. 1.

FIG. 4 is a circuit diagram illustrating an example of a reference voltage providing portion and a pixel portion included in a display device of FIG. 1.

Referring to FIG. 4, the display panel may include a reference voltage providing portion 120A and a pixel portion 140A.

The reference voltage providing portion 120A may apply a first reference voltage VREF1 to a plurality of readout lines in response to the scan signal. The reference voltage providing portion 120A may include a plurality of sensing transistors TC. Each sensing transistor TC may include a gate electrode for receiving the scan signal, a first electrode for receiving the first reference voltage VREF1, and a second electrode connected to one of the readout lines. For example, the sensing transistor TC may provide the first reference voltage VREF1 to the readout line RLj in response to the scan signal received from the scan driver 300 via the (0)th scan line SL0.

The reference voltage providing portion 120A may be connected to first terminals of the readout lines RL1 through RLm. The readout circuit 500A may be connected to second terminals of the readout lines RL1 through RLm. Thus, the reference voltage providing portion 120A may be located opposite to the readout circuit 500A with the pixel portion 140A therebetween. Therefore, if a crack occurs in the pixel portion 140A due to physical impact, a sensed voltage at the second terminal of the readout line RLj may be changed when the first reference voltage VREF1 is applied to the first terminal of the readout line RLj. Thus, the readout circuit 500A may sense a voltage of the second terminal of the readout line RLj as a crack sensing voltage to confirm whether the crack occurs in the pixel portion 140A or not.

Each pixel of the pixel portion 140A may include first through third transistors T1 through T3, a storage capacitor CST, and an OLED. The first transistor T1 may include a gate electrode connected to a first node N1, a first electrode for receiving a first power voltage ELVDD, and a second electrode connected to a second node N2. The second transistor T2 may include a gate electrode connected to a scan line SLi, a first electrode connected to a data line DLj, and a second electrode connected to the first node N1. The third transistor T3 may include a gate electrode connected to the scan line SLi, a first electrode connected to the second node N2, and a second electrode connected to the readout line RLj. The storage capacitor CST may be connected between the first node N1 and the second node N2. The data line DLj may receive the data signal DS via a digital to analog converter DACj.

The OLED may include a first electrode connected to the second node N2 and a second electrode selectively receiving the first power voltage ELVDD or a second power voltage ELVSS. The second electrode of the OLED may receive the second power voltage ELVSS during a displaying period such that the driving current flows through the OLED. The second electrode of the OLED may receive the first power voltage ELVDD during a deterioration sensing period in order to measure a threshold voltage of the driving transistor (i.e., the first transistor T1).

In the display device compensating for the variation of pixels using the readout circuit, the second transistor T2 connected to the data line DLj and the third transistor T3 connected to the readout line RLj are turned on in response to the scan signal received from a single scan line to increase an opening ratio of the display panel. In this case, to detect a crack in the display panel while the display device is being driven, the (0)th stage is added in the scan driver and the reference voltage providing portion 120A provides the first reference voltage VREF1 to the readout line RLj in response to the scan signal received from the (0)th scan line SL0. In this way, a crack in the display panel can be detected while the display device is being driven and the non-display period can be reduced or minimized in the display device progressively displaying the image in a direction along which the scan lines are arranged (i.e., driven in a progressive emission manner).

Figure 5:
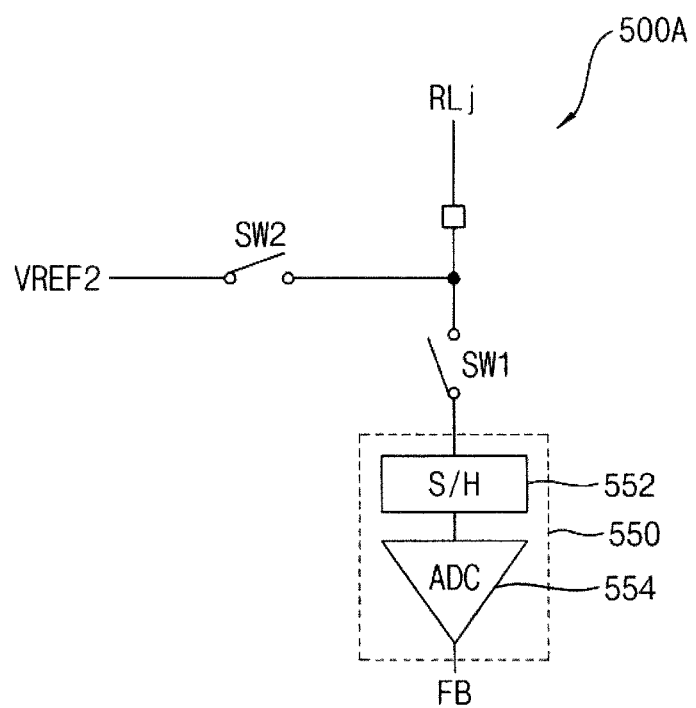
FIG. 5 is a circuit diagram illustrating an example of a readout circuit included in a display device of FIG. 1.

FIG. 5 is a circuit diagram illustrating an example of a readout circuit included in a display device of FIG. 1.

Referring to FIG. 5, the readout circuit 500A may include an analog-digital converter 550, a first switch SW1, and a second switch SW2. The analog-digital converter 550 may convert a voltage of the readout lines RLj into the digital data. The second switch SW2 may be located between a second reference power source and the readout line RLj. The first switch SW1 may be located between the analog-digital converter 550 and the readout line RLj.

In one example embodiment, the first switch SW1 may be turned on and the second switch SW2 may be turned off during a crack sensing period. Thus, during the crack sensing period, the reference voltage providing portion may apply the first reference voltage to the first terminal of the readout line RLj, and the analog-digital converter 550 may receive the voltage of the second terminal of the readout line RLj via the turned-on first switch SW1 and may convert the voltage of the second terminal of the readout line RLj to the digital data to confirm whether a crack in the display panel occurs or not.

In one example embodiment, the first switch SW1 may be turned off and the second switch SW2 may be turned on during a displaying period. Thus, the second reference voltage VREF2 may be applied to the readout line RLj and the first electrode of the OLED during the display period. Accordingly, the driving current can flow through the OLED.

In one example embodiment, the first switch SW1 may be turned on and the second switch SW2 may be turned off during a deterioration sensing period. Thus, during the deterioration sensing period, the analog-digital converter 550 may receive the voltage of the second terminal of the readout line RLj via the turned-on first switch SW1 and may convert the voltage of the second terminal of the readout line RLj into the digital data to measure characteristics (e.g., threshold voltage) of the driving transistor in the pixel.

In one example embodiment, the analog-digital converter 550 may include a sampling-holding circuit 552 and an analog-digital converting circuit 554. The sampling-holding circuit 552 may sample and hold the voltage of the readout line RLj so as to output a readout voltage. For example, the sampling-holding circuit 552 may include a capacitor, an input switch for charging the voltage of the readout line RLj to the capacitor, and an output switch outputting the readout voltage charged in the capacitor. The analog-digital converting circuit 554 may convert the readout voltage into the digital data.

Although the example embodiment of FIG. 5 describes that the readout circuit 500A measures the threshold voltage of the driving transistor as the deterioration data of the pixel, it is not limited thereto. For example, the readout circuit 500A may further include a current-voltage converter that can measure the mobility of the driving transistor using an integrator.

Figure 6:
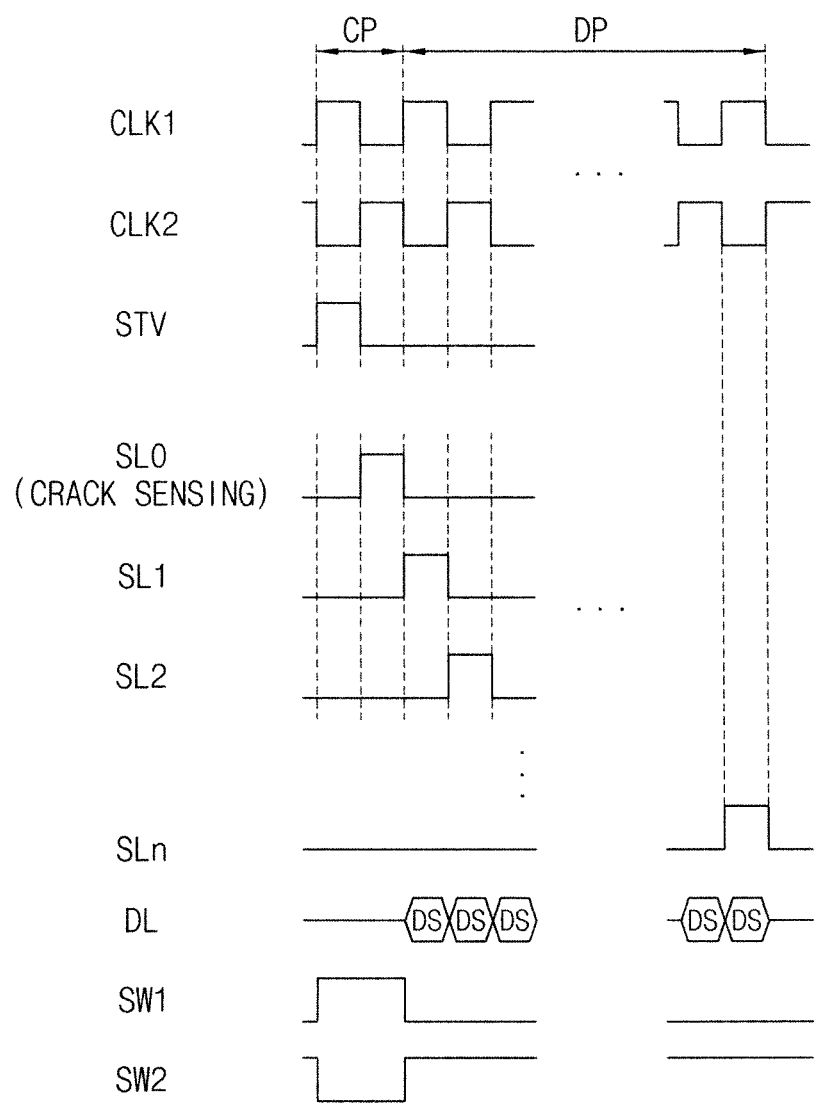
FIG. 6 is a waveform illustrating an example in which a display device of FIG. 1 is driven during a crack sensing period and a displaying period.

FIG. 6 is a waveform illustrating an example in which a display device of FIG. 1 is driven during a crack sensing period and a displaying period.

Referring to FIGS. 2, 4, 5, and 6, a crack sensing period CP may be interposed between displaying periods DP. Accordingly, a crack in the display panel can be detected while the display device is driven.

In the crack sensing period CP, the (0)th stage of the scan driver may receive the scan start signal STV and output the scan signal to the (0)th scan line SL0 based on the scan start signal STV. The reference voltage providing portion may receive the scan signal from the (0)th scan lines and may apply the first reference voltage to the first terminal of the readout line. The first switch may be turned on and the second switch may be turned off. The readout circuit may convert the voltage of the second terminal of the readout line into the digital data to measure the crack sensing voltage.

In the displaying period DP, the (1)st stage of the scan driver may receive the output signal (i.e., previous scan signal) from the (0)th stage, and the (1)st through (N)th stages may progressively output the scan signal to the (1)st through (N)th scan lines SL1 through SLn. When the scan signal is progressively provided to the scan lines, the pixel receives the data signal DS via the data lines. The second switch may be turned on and the first switch may be turned off. The second reference voltage may be applied to a node between the driving transistor and the OLED via the readout line, and the pixel may display an image corresponding to the data signal DS.

Figure 7:
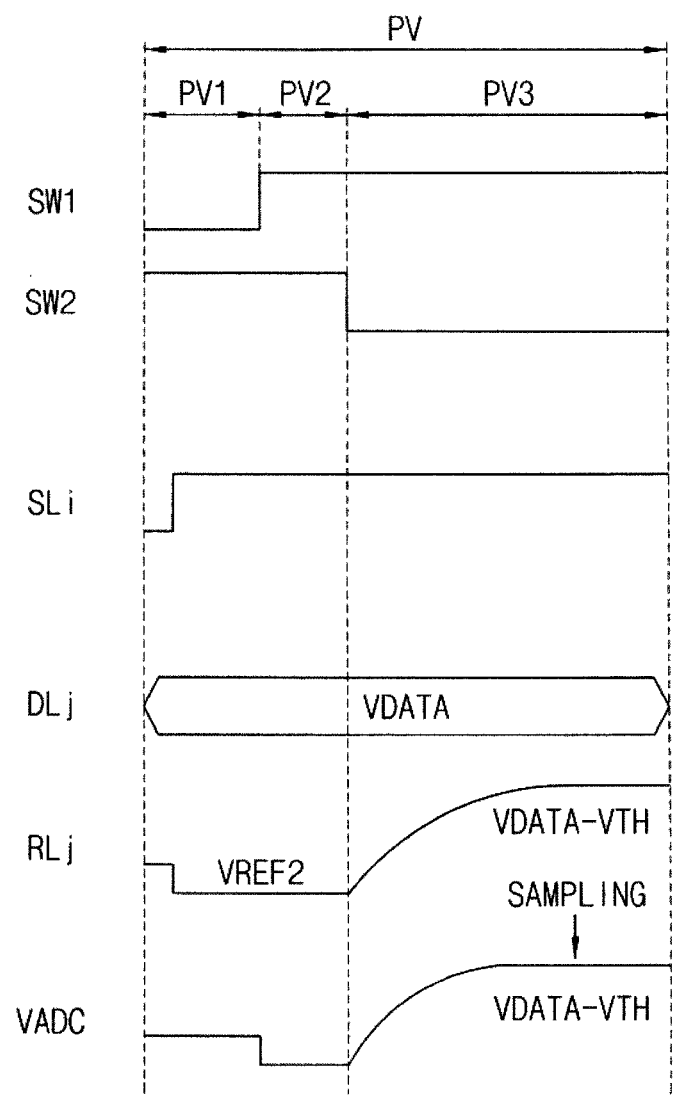
FIG. 7 is a waveform illustrating an example in which a display device of FIG. 1 is driven during a deterioration sensing period.

FIG. 7 is a waveform illustrating an example in which a display device of FIG. 1 is driven during a deterioration sensing period.

Referring to FIGS. 4, 5, and 7, the pixel receives the scan signal from the scan line SLi and a first data voltage VDATA as the data signal DS during the deterioration sensing period PV.

During a first period PV1 of the deterioration sensing period PV, the first switch SW1 may be turned off and the second switch SW2 may be turned on. Therefore, the second reference voltage VREF2 may be applied to the readout line RLj, and the readout line RLj may be initialized during the first period PV1.

During a second period PV2 of the deterioration sensing period PV, the first and the second switches SW1 and SW2 may be turned on. Therefore, the second reference voltage VREF2 may be applied to a sampling-holding circuit 552 of an analog-digital converter, and the sampling-holding circuit 552 may be initialized in the second period PV2.

During a third period PV3 of the deterioration sensing period PV, the first switch SW1 may be turned on and the second switch SW2 may be turned off. In the pixel, a current flowing from the first transistor T1 may be outputted via the turned-on third transistor T3 and the readout line RLj. A voltage of the readout line RLj may increase in proportion to the current flowing from the first transistor T1. When a voltage of the storage capacitor CST reaches the threshold voltage VTH of the first transistor T1, the voltage of the readout line RLj may be saturated at a voltage difference VDATA−VTH between the first data voltage VDATA and the threshold voltage VTH of the first transistor T1. At this time, the threshold voltage VTH of the first transistor T1 (i.e., the driving transistor) may be derived by sampling the voltage VDATA−VTH of the readout line RLj (see VADC in FIG. 7).

Figure 8:
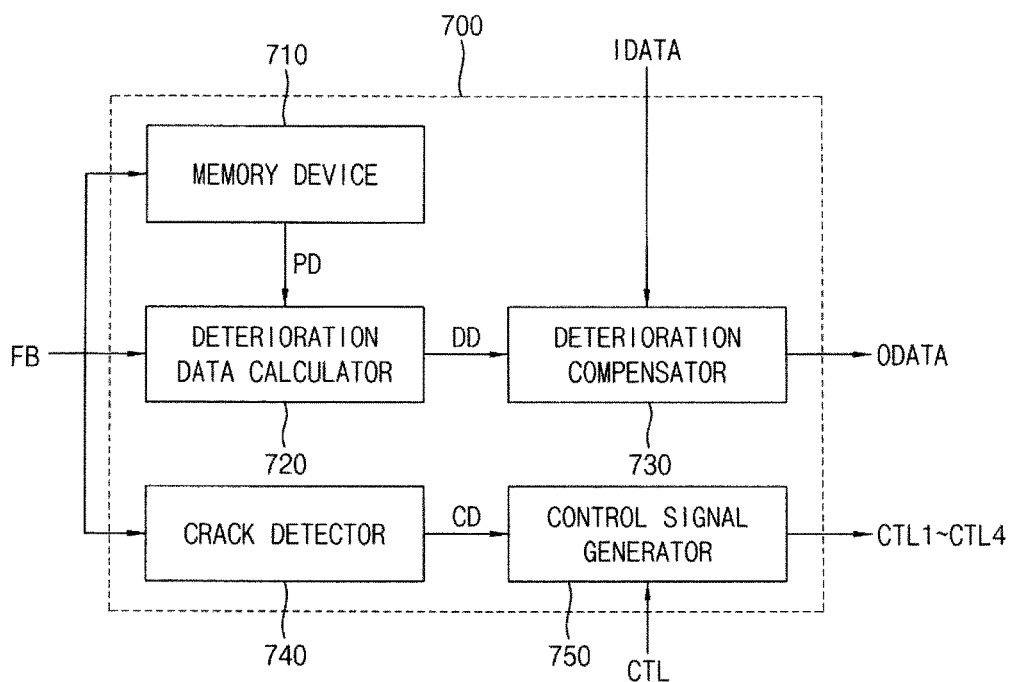
FIG. 8 is a block diagram illustrating an example of a controller included in a display device of FIG. 1.

FIG. 8 is a block diagram illustrating an example of a controller included in a display device of FIG. 1.

Referring to FIG. 8, the controller 700 may include a memory device 710, a deterioration data calculator 720, a deterioration compensator 730, a crack detector 740, and a control signal generator 750.

The memory device 710 may store a deterioration sensing voltage as the deterioration data. For example, the memory device 710 may store an initialization deterioration sensing voltage corresponding to a threshold voltage of the driving transistor measured at the initial driving time. In addition, the memory device 710 may store a crack sensing voltage. For example, a first reference voltage is applied to a first terminal of the readout line at the initial driving time, and a voltage of the second terminal of the readout line is sensed to derive an initial crack sensing voltage.

In one example embodiment, the memory device 710 may include a non-volatile memory device. The non-volatile memory device may have a variety of features such as capability to maintain stored data while power is not supplied, capability to store mass data, low cost, etc. For example, the memory device 710 may include flash memory, erasable programmable read-only memory (EPROM), electrically erasable programmable read-only memory (EEPROM), phase change random access memory (PRAM), resistance random access memory (RRAM), nano floating gate memory (NFGM), polymer random access memory (PoRAM), magnetic random access memory (MRAM), ferroelectric random access memory (FRAM), etc.

In one example embodiment, the memory device 710 may store a deterioration sensing voltage and a crack sensing voltage for a pixel group. For example, a single pixel group may be composed of adjacent pixels included in a 4 by 4 matrix. Especially in the high resolution display device, the deterioration sensing voltage for the pixel group may be derived and stored to improve the efficiency of the memory device 710 because deterioration degrees of the adjacent pixels may be similar to each other.

The deterioration data calculator 720 may compare a current deterioration sensing voltage of the pixels derived from the digital data with a previous deterioration sensing voltage to calculate deterioration data of the pixels. For example, the deterioration data calculator 720 may receive the previous deterioration sensing voltage PD sensed at the initial driving time from the memory device 710. Thereafter, the deterioration data calculator 720 may derive the deterioration data DD of the pixels from a voltage difference between the current deterioration sensing voltage in the digital data FB and the previous deterioration sensing voltage PD and may output the deterioration data DD.

The deterioration compensator 730 may compensate input image data IDATA based on the deterioration data DD. For example, the deterioration compensator 730 may derive an adjusting value corresponding to a voltage difference between the current deterioration sensing voltage and the previous deterioration sensing voltage PD using a look-up table. The deterioration compensator 730 may generate output image data ODATA by summing the input image data IDATA and the adjusting value.

The crack detector 740 may compare a current crack sensing voltage derived from the digital data FB with a threshold value to generate a power-off signal CD. In one example embodiment, the crack detector 740 may generate a power-off signal CD when the current crack sensing voltage is outside of a voltage range (e.g., a predetermined voltage range). In another example embodiment, the crack detector 740 may generate the power-off signal CD when a voltage difference between the current crack sensing voltage and a previous crack sensing voltage stored in the memory device 710 is greater than the threshold value.

The control signal generator 750 may receive an input control signal CTL and may generate first through fourth control signals CTL1 through CTL4 for controlling the scan driver, the data driver, the readout circuit, and the power supply based on the input control signal CTL. The control signal generator 750 may control the fourth control signal CTL4 provided to the power supply to cut off the power for driving the display device when the control signal generator 750 receives the power-off signal CD.

A short circuit between the first power line and the second power line can occur due to an external impact. In this case, overcurrent can flow through the display panel, and the display panel can be destroyed or a fire may break out in the display device. Therefore, the controller 700 may stably drive the display panel by detecting a crack in the pixel portion using the crack sensing voltage.

Figure 9:
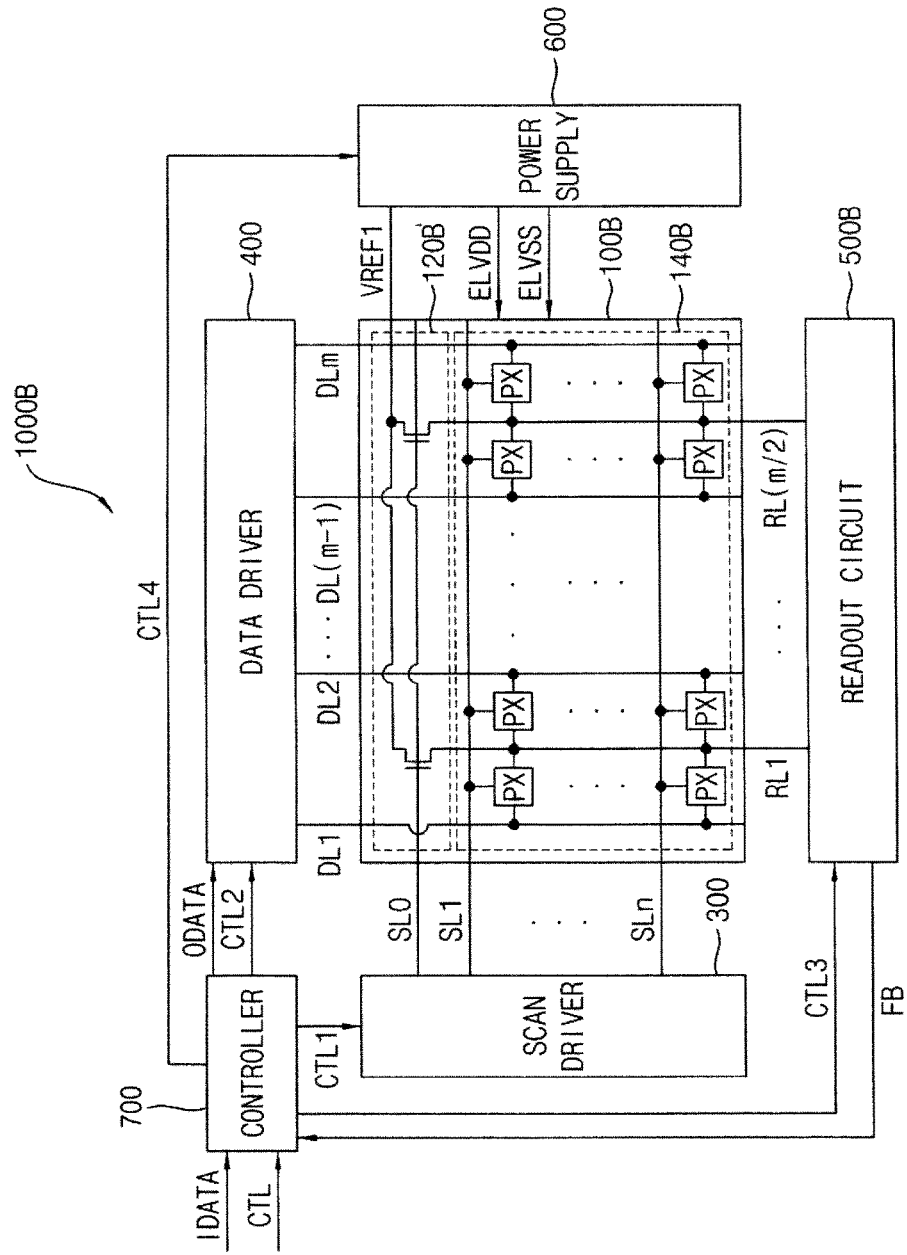
FIG. 9 is a block diagram illustrating a display device according to another example embodiment.
Figure 10:
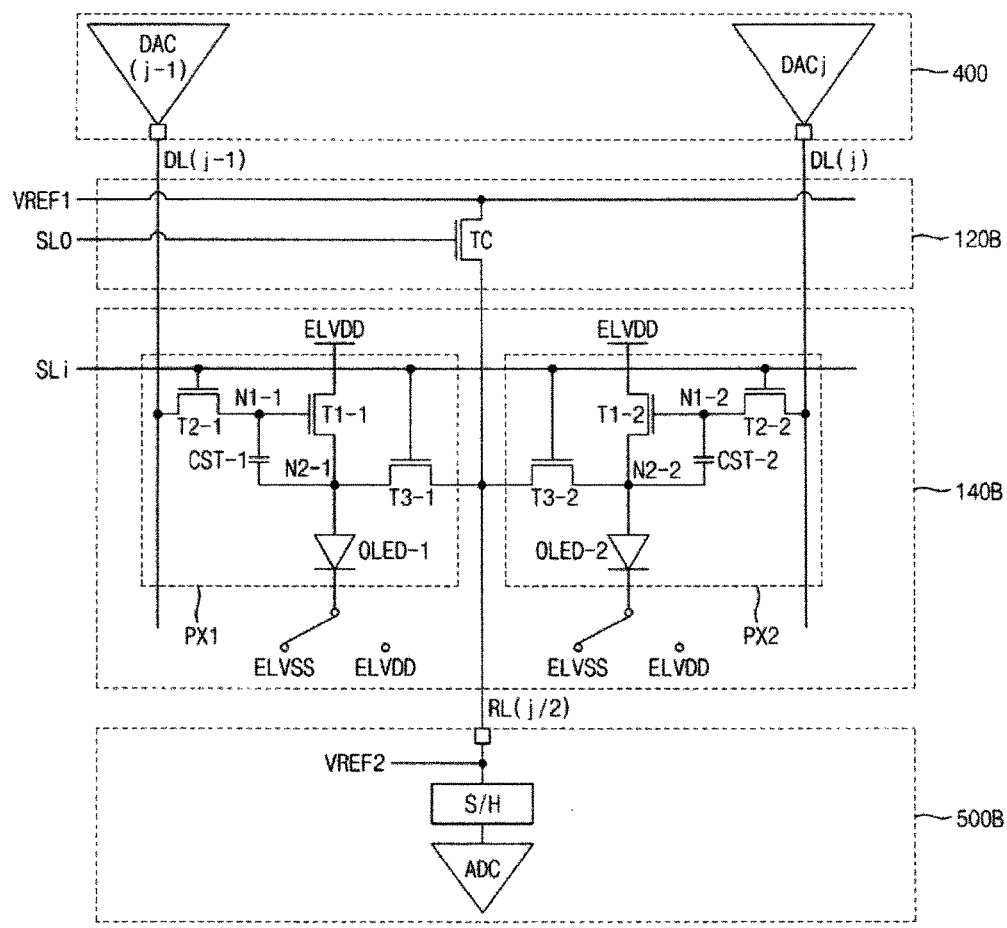
FIG. 10 is a circuit diagram illustrating an example of a reference voltage providing portion and a pixel portion included in a display device of FIG. 9.
Figure 11:
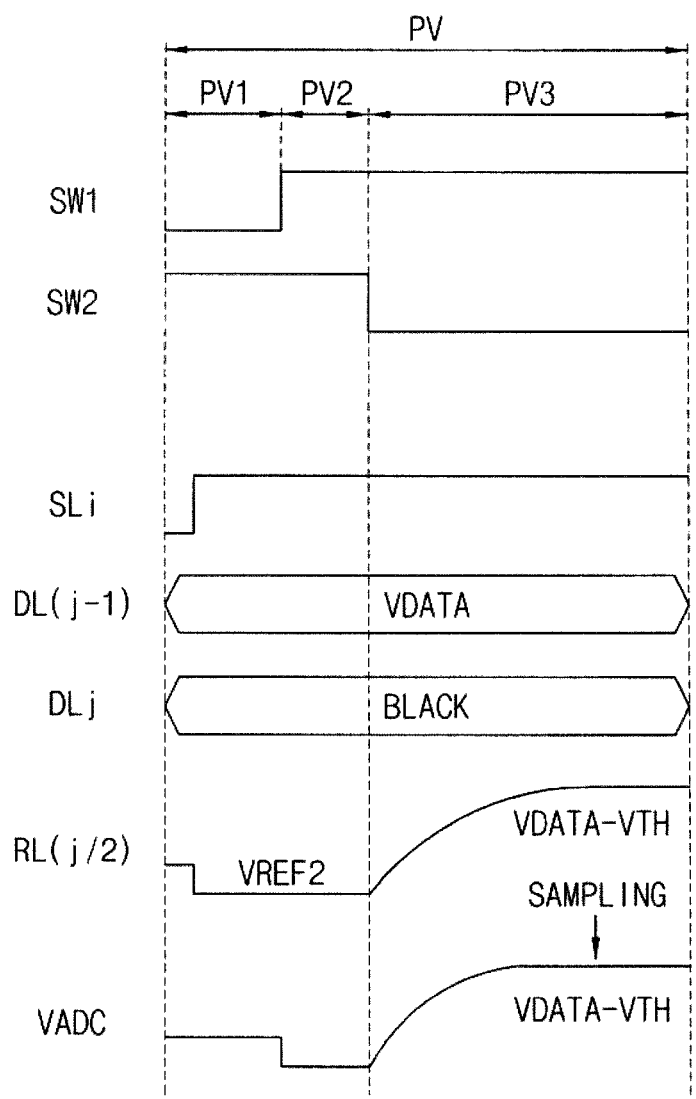
FIG. 11 is a waveform illustrating an example in which a display device of FIG. 10 is driven during a deterioration sensing period.

FIG. 9 is a block diagram illustrating a display device according to another example embodiment. FIG. 10 is a circuit diagram illustrating an example of a reference voltage providing portion and a pixel portion included in a display device of FIG. 9. FIG. 11 is a waveform illustrating an example in which a display device of FIG. 10 is driven during a deterioration sensing period.

Referring to FIGS. 9 through 11, the display device 1000B may include a display panel 1006, a scan driver 300, a data driver 400, a readout circuit 500B, a power supply 600, and a controller 700. The display device 10006 according to the present exemplary embodiment is substantially similar to the display device of the exemplary embodiment described in FIG. 1, except that two adjacent pixels connected to the same scan line share one readout line. Therefore, the same reference numerals may be used to refer to the same or like parts as those described in the previous exemplary embodiment of FIG. 1, and any repetitive explanation concerning the above elements (or components) may be omitted.

The display panel 100B may include a reference voltage providing portion 120B and a pixel portion 140B.

The reference voltage providing portion 120B may apply a first reference voltage VREF1 to a plurality of readout lines RL1 through RL(m/2). In one example embodiment, the reference voltage providing portion 120B may include a plurality of sensing transistors. Each sensing transistor may include a gate electrode for receiving the scan signal, a first electrode for receiving the first reference voltage VREF1, and a second electrode connected to one of the readout lines RL1 through RL(m/2). For example, the sensing transistor TC may apply the first reference voltage VREF1 to the readout line in response to the scan signal received from the scan driver 300 via the (0)th scan line SL0.

The reference voltage providing portion 120B may be connected to first terminals of the readout lines RL1 through RL(m/2). The readout circuit 500B may be connected to second terminals of the readout lines RL1 through RL(m/2). Thus, the pixel portion 140B may be located between the reference voltage providing portion 120B and the readout circuit 500B.

The pixel portion 140B may include a plurality of pixels PX connected to the readout lines RL1 through RL(m/2). For example, the pixel portion 140B may include n*m pixels PX arranged at locations corresponding to crossing regions of a plurality of scan lines SL1 through SLn and a plurality of data lines DL1 through DLm. At least two adjacent pixels connected to the same scan line may share one readout line to increase an opening ratio of the display panel 1006.

The scan driver 300 may provide a scan signal to the pixels PX via the scan lines SL1 through SLn based on a first control signal CTL1. The scan driver 300 may provide the scan signal to the reference voltage providing portion 1206 via the (0)th scan line SL0 and may provide the scan signal to the pixel portion 140B via the (1)st through (N)th scan lines SL1 through SLn.

The data driver 400 may provide a data signal DS to the pixels PX via the data lines DL1 through DLm based on a second control signal CTL2.

The readout circuit 500B may be connected to the readout lines RL1 through RL(m/2) and may measure a crack sensing voltage or a deterioration sensing voltage based on a third control signal CTL3. The readout circuit 500B may convert voltages of the readout lines RL1 through RL(m/2) to digital data FB and may provide the converted digital data FB as a crack sensing voltage or a deterioration sensing voltage to the controller 700.

The power supply 600 may provide power voltages to the display panel 100B based on the fourth control signal CTL4.

The controller 700 may generate the first through fourth control signals CTL1 through CTL4 based on an input control signal CTL. In addition, the controller 700 may receive the digital data FB from the readout circuit 500B. The controller 700 may cut off the power when a crack in the display panel 100B is detected based on the crack sensing voltages included in the digital data FB.

As shown in FIG. 10, a first pixel PX1 and a second pixel PX2 adjacent to the first pixel PX1 may be connected to one readout line RL(j/2). The readout circuit 500B may convert a voltage of the readout line RL(j/2) into the digital data FB as the crack sensing voltage during the crack sensing period to confirm whether a crack in the pixel portion 140B occurs or not. The readout circuit 500B may provide the second reference voltage VREF2 to each node between the driving transistor and the OLED included in each of the first and second pixels PX1 and PX2 via the readout line RL(j/2) during the displaying period. In addition, the readout circuit 500B may convert the voltage of the readout line RL(j/2) into the digital data FB as the deterioration sensing voltage for the first and second pixels PX1 and PX2 during the deterioration sensing period. Here, the deterioration sensing voltage may correspond to a threshold voltage of the driving transistor in each pixel.

As shown in FIG. 11, the first pixel PX1 and the second pixel PX2 sharing the readout line RL(j/2) may receive the scan signal from the connected scan line SLi during the deterioration sensing period PV. The first pixel PX1 may receive a first data voltage VDATA (e.g., a predetermined first data voltage VDATA) as the data signal DS, and the second pixel PX2 may receive a second data voltage BLACK corresponding to the black color as the data signal DS to measure a threshold voltage of one driving transistor (i.e., the driving transistor of the first pixel PX1) via the readout line RL(j/2) during the deterioration sensing period PV.

Because the driving operation of the display device during the deterioration sensing period PV having the first through third periods PV1 through PV3 is described above, duplicated descriptions may be omitted.

Figure 12:
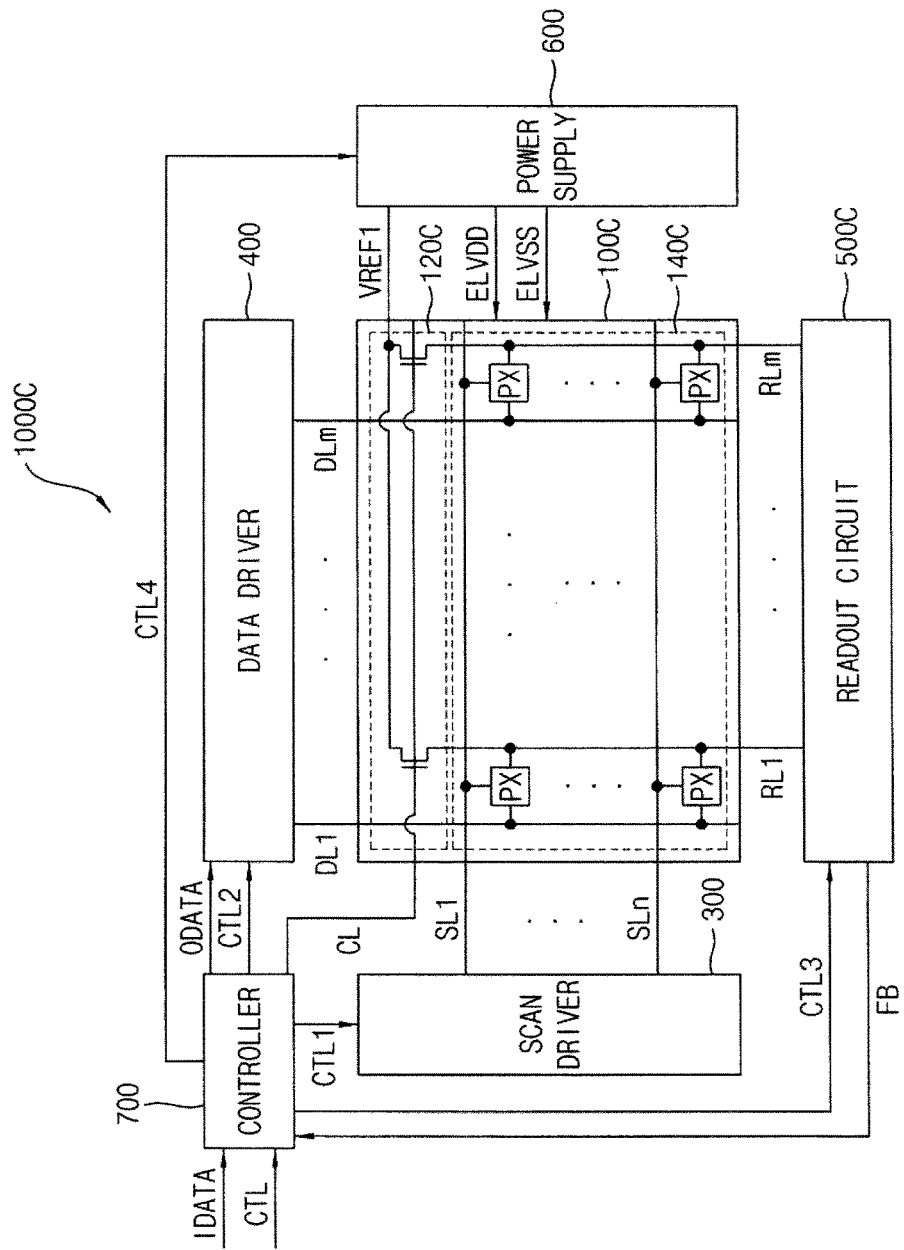
FIG. 12 is a block diagram illustrating a display device according to still another example embodiment.
Figure 13:
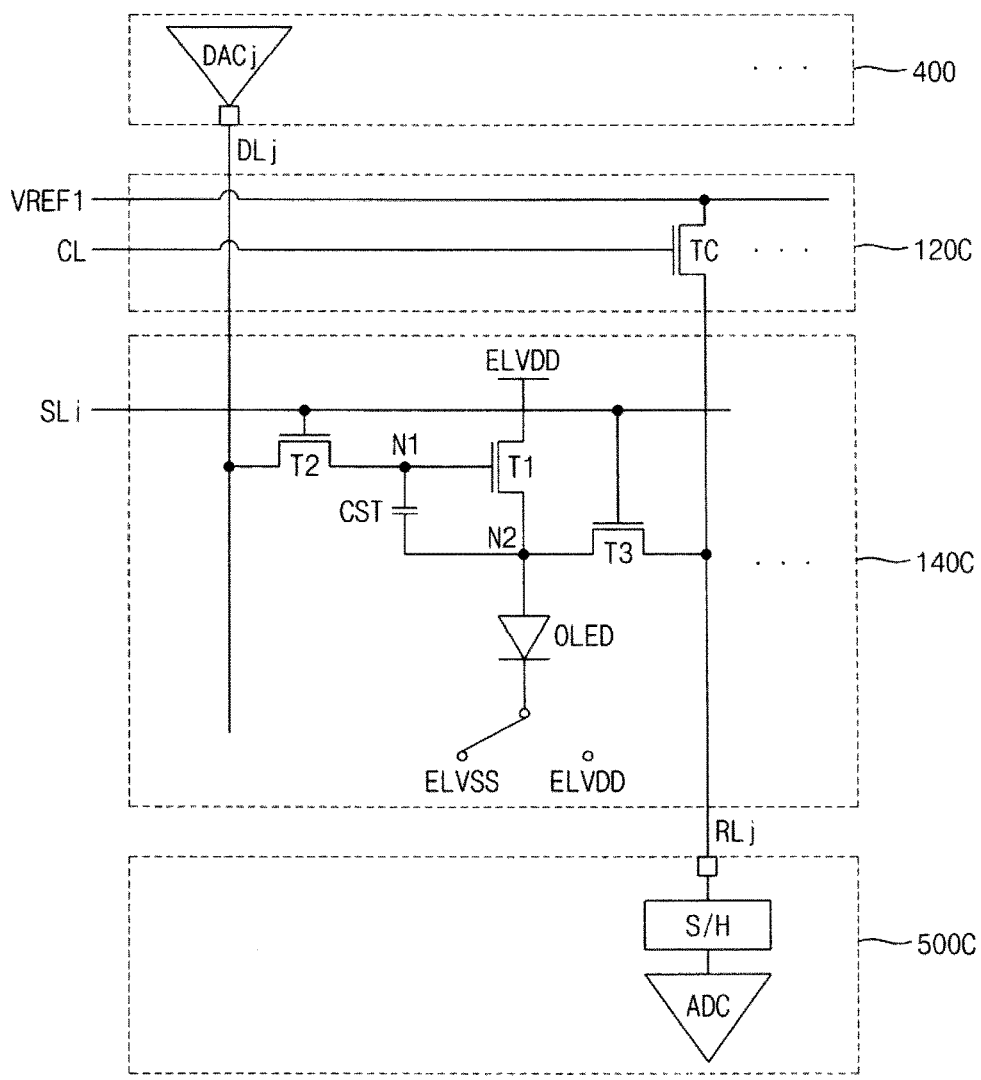
FIG. 13 is a circuit diagram illustrating an example of a reference voltage providing portion and a pixel portion included in a display device of FIG. 12.

FIG. 12 is a block diagram illustrating a display device according to still another example embodiment. FIG. 13 is a circuit diagram illustrating an example of a reference voltage providing portion and a pixel portion included in a display device of FIG. 12.

Referring to FIGS. 12 and 13, the display device 1000C may include a display panel 100C, a scan driver 300, a data driver 400, a readout circuit 500C, a power supply 600, and a controller 700. The display device 1000C according to the present exemplary embodiment is substantially similar to the display device of the exemplary embodiment described in FIG. 1, except that a reference voltage providing portion 120C of the display panel 100C applies the first reference voltage to the readout line in response to a sensing control signal received from the controller 700. Therefore, the same reference numerals may be used to refer to the same or like parts as those described in the previous exemplary embodiment of FIG. 1, and any repetitive explanation concerning the above elements (or components) may be omitted.

The display panel 100C may include a reference voltage providing portion 120C and a pixel portion 140C.

The reference voltage providing portion 120C may apply a first reference voltage VREF1 to a plurality of readout lines RL1 through RLm in response to the sensing control signal. In one example embodiment, the reference voltage providing portion 120C may include a plurality of sensing transistors. Each sensing transistor may include a gate electrode for receiving the sensing control signal, a first electrode for receiving the first reference voltage VREF1, and a second electrode connected to one of the readout lines RL1 through RLm.

In one example embodiment, the sensing control signal may be substantially the same as a scan start signal for driving the scan driver 300. In this case, because the sensing transistors in the reference voltage providing portion 120C may be turned on in response to the scan start signal, the scan driver 300 does not need to add the additional stage (e.g., the (0)th stage of the exemplary embodiments described in FIGS. 1 and 9). In another example embodiment, the sensing control signal may be provided to the reference voltage providing portion 120C to turn the sensing transistor on during the displaying period in which the pixels display the image. In this case, the first reference voltage VREF1 may be used as a reference voltage applied to the pixel (e.g., a node between the driving transistor and the OLED) in order that the driving current flows through the OLED during the displaying period as well as a reference voltage for confirming whether or not a crack occurs in the pixel portion 140C during the crack sensing period.

The pixel portion 140C may include a plurality of pixels PX connected to the readout lines RL1 through RLm. The pixel portion 140C may be located between the reference voltage providing portion 120C and the readout circuit 500C.

The scan driver 300 may provide a scan signal to the pixels PX via the scan lines SL1 through SLn based on a first control signal CTL1.

The data driver 400 may provide a data signal DS to the pixels PX via the data lines DL1 through DLm based on a second control signal CTL2.

The readout circuit 500C may be connected to the readout lines RL1 through RLm. The readout circuit 500C may convert a voltage of the readout line to digital data FB and may provide the converted digital data FB as a crack sensing voltage or a deterioration sensing voltage to the controller 700 based on a third control signal CTL3.

The power supply 600 may provide power voltages to the display panel 100C based on the fourth control signal CTL4.

The controller 700 may generate the first through fourth control signals CTL1 through CTL4 based on an input control signal CTL. The controller 700 may provide the sensing control signal to the reference voltage providing portion 120C via a control line CL in the crack sensing period. In addition, the controller 700 may receive the digital data FB from the readout circuit 500C. The controller 700 may cut off the power when a crack in the display panel 100C is detected based on the crack sensing voltages derived from the digital data FB.

Figure 14:
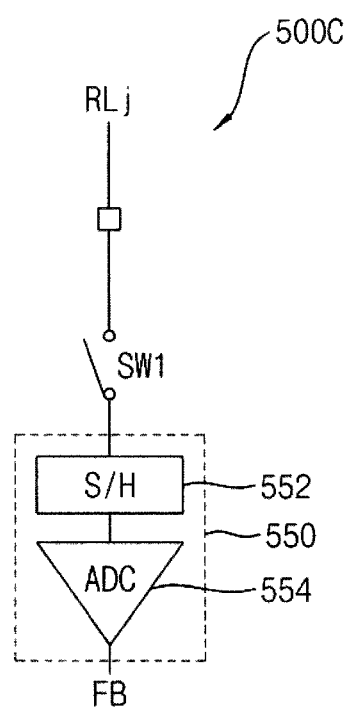
FIG. 14 is a circuit diagram illustrating an example of a readout circuit included in a display device of FIG. 12.
Figure 15:
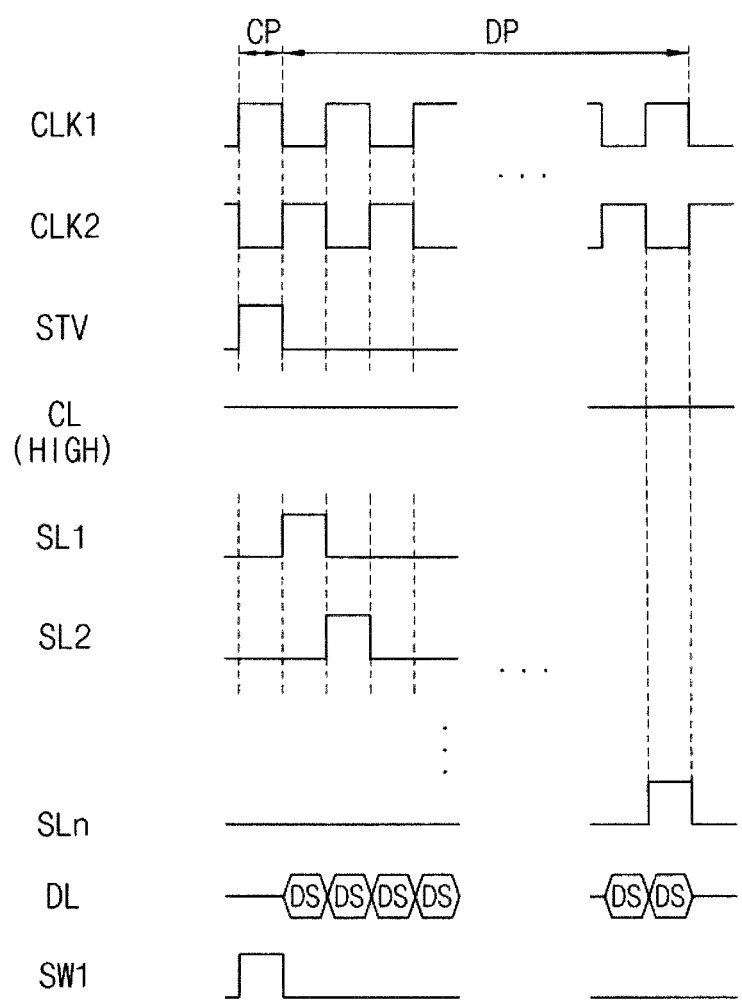
FIG. 15 is a waveform illustrating an example in which a display device of FIG. 12 is driven during a crack sensing period and a displaying period.

FIG. 14 is a circuit diagram illustrating an example of a readout circuit included in a display device of FIG. 12. FIG. 15 is a waveform illustrating an example in which a display device of FIG. 12 is driven during a crack sensing period and a displaying period.

Referring to FIGS. 14 and 15, the sensing control signal may be provided to the reference voltage providing portion such that the sensing transistors are turned on during the crack sensing period CP and the displaying period DP.

As shown in FIG. 15, the first reference voltage VREF1 may be applied to the first terminal of the readout line and the readout circuit may sense the voltage of the second terminal of the readout line as the crack sensing voltage via the turned-on first switch SW1 to confirm whether or not a crack occurs in the pixel portion during the crack sensing period CP.

In addition, the first reference voltage VREF1 may be applied to a node between the driving transistor and the OLED in each pixel via the readout line such that the driving current flows through the OLED during the displaying period DP in which the scan signal is progressively outputted to the (1)st through (N)th scan lines. Therefore, as shown in FIG. 14, the readout circuit 500C includes the first switch SW1 and the analog-digital converter 550 and does not include a circuit applying the second reference voltage to the readout line (e.g., the second switch of the exemplary embodiment described in FIG. 5).

Although a display device according to example embodiments has been described with reference to the figures, those skilled in the art will readily appreciate that many modifications are possible in the example embodiments without materially departing from the novel teachings and features of the present inventive concept. For example, although the example embodiments describe that the display device is an organic light emitting display device, the type of display device is not limited thereto.

The present inventive concept may be applied to an electronic device having the display device. For example, the present inventive concept may be applied to a cellular phone, a smart phone, a smart pad, a personal digital assistant (PDA), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present inventive concept. Accordingly, all such modifications are intended to be included within the scope of the present inventive concept as defined in the claims and their equivalents.

What is claimed is:

1. A display device comprising:
a display panel comprising:
a reference voltage providing portion configured to apply a first reference voltage from a first reference voltage line to a plurality of readout lines, the first reference voltage being a voltage for detecting a crack in the display panel; and
a pixel portion comprising a plurality of pixels connected to the readout lines;
a scan driver configured to provide a scan signal to the pixels via a plurality of scan lines;
a data driver configured to provide a data signal to the pixels via a plurality of data lines;
a readout circuit configured to convert voltages of the readout lines to digital data, and configured to apply a second reference voltage that is different from the first reference voltage to one of the readout lines; and
a controller configured to cut off a power based on the digital data,
wherein the reference voltage providing portion comprises a plurality of sensing transistors each comprising:
a gate electrode coupled to one of the scan lines or to a control line;
a first electrode coupled to the first reference voltage line; and
a second electrode connected both to the readout circuit via one of the readout lines and to one of the pixels.

2. The display device of claim 1,
wherein the scan driver comprises (0)th through (N)th stages dependently connected to each other and configured to progressively output the scan signal, where N is an integer greater than 0,
wherein the (0)th stage is configured to provide the scan signal to the reference voltage providing portion, and
wherein the (1)st through the (N)th stages are configured to provide the scan signal to the pixel portion.

3. The display device of claim 1, wherein the reference voltage providing portion is connected to first terminals of the readout lines, and
wherein the readout circuit is connected to second terminals of the readout lines.

4. The display device of claim 1, wherein the readout circuit comprises:
an analog-digital converter configured to convert a voltage of the one of the readout lines into the digital data;
a first switch located between the analog-digital converter and the one of the readout lines; and
a second switch located between a second reference power source, which is configured to apply the second reference voltage that is different from the first reference voltage, and the one of the readout lines.

5. The display device of claim 4, wherein the readout circuit is configured to turn on the first switch and to turn off the second switch during a crack sensing period in which the first reference voltage is applied to the readout lines.

6. The display device of claim 4, wherein the readout circuit is configured to turn off the first switch and to turn on the second switch during a displaying period in which the pixels display an image.

7. The display device of claim 4, wherein the readout circuit is configured to turn on the first switch and to turn off the second switch during a deterioration sensing period in which deterioration data of the pixels are measured.

8. The display device of claim 4, wherein the analog-digital converter comprises:
a sampling-holding circuit configured to sample and hold the voltage of the one of the readout lines so as to output a readout voltage; and
an analog-digital converting circuit configured to convert the readout voltage into the digital data.

9. The display device of claim 1, wherein the controller comprises:
a deterioration data calculator configured to compare a current deterioration sensing voltage of the pixels derived from the digital data with a previous deterioration sensing voltage to calculate deterioration data of the pixels;
a deterioration compensator configured to compensate input image data based on the deterioration data;

a crack detector configured to compare a current crack sensing voltage derived from the digital data with a threshold value to generate a power-off signal; and a control signal generator configured to generate a control signal to cut off power based on the power-off signal.

10. The display device of claim 9, wherein the crack detector is configured to generate the power-off signal when a voltage difference between the current crack sensing voltage and a previous crack sensing voltage stored in a memory device is greater than the threshold value.

11. The display device of claim 1, wherein the controller is configured to provide a sensing control signal to the control line, the sensing control signal being substantially the same as a scan start signal for driving the scan driver.

12. The display device of claim 1, wherein the controller is configured to turn on the sensing transistors during a displaying period in which the pixels display an image.

13. The display device of claim 1, wherein each of the pixels comprises:

a first transistor comprising a gate electrode connected to a first node, a first electrode coupled to a first power line, and a second electrode connected to a second node;

a second transistor comprising a gate electrode connected to one of the scan lines, a first electrode connected to one of the data lines, and a second electrode connected to the first node;

a third transistor comprising a gate electrode connected to the one of the scan lines, a first electrode connected to the second node, and a second electrode connected to one of the readout lines;

a storage capacitor connected between the first node and the second node; and an organic light emitting diode (OLED) comprising a first electrode connected to the second node and a second electrode selectively coupled to the first power line or a second power line.

14. The display device of claim 13, wherein the second electrode of the QLED is configured to be coupled to the second power line during a displaying period and is configured to be coupled to the first power line during a deterioration sensing period.

15. A display device comprising:

a display panel comprising a reference voltage providing portion configured to apply a first reference voltage from a first reference voltage line to a readout line and a pixel portion comprising a plurality of pixels, the first reference voltage being a voltage for detecting a crack in the display panel;

a scan driver configured to provide a scan signal to the pixels via a plurality of scan lines;

a data driver configured to provide a data signal to the pixels via a plurality of data lines; and a readout circuit configured to convert a voltage of the readout line to digital data, and configured to apply a second reference voltage that is different from the first reference voltage to one of the readout lines, wherein at least two of the pixels are connected to one of the scan lines and connected to the readout line, and wherein the reference voltage providing portion comprises a sensing transistor comprising:

a gate electrode coupled to one of the scan lines or to a control line;

a first electrode coupled to the first reference voltage line; and a second electrode connected both to the readout circuit via the readout line and to the at least two pixels.

16. The display device of claim 15, wherein the scan driver comprises (0)th through (N)th stages dependently connected to each other and configured to progressively output the scan signal, where N is an integer greater than 0, wherein the (0)th stage is configured to provide the scan signal to the reference voltage providing portion, and wherein the (1)st through the (N)th stages are configured to provide the scan signal to the pixel portion.

17. The display device of claim 15, wherein the reference voltage providing portion is connected to a first terminal of the readout line, and wherein the readout circuit is connected to a second terminal of the readout line.

* * * * *